United States Patent [19]

Kasperkovitz

[11] 4,011,580
[45] Mar. 8, 1977

[54] INTEGRATED CIRCUIT

[75] Inventor: Wolfdietrich Georg Kasperkovitz, Eindhoven, Netherlands

[73] Assignee: U.S. Philips Corporation, New York, N.Y.

[22] Filed: Jan. 23, 1976

[21] Appl. No.: 651,773

Related U.S. Application Data

[63] Continuation of Ser. No. 472,412, May 22, 1974, abandoned.

[52] U.S. Cl. .................................. 357/51; 357/48
[51] Int. Cl.[2] ......................................... H01L 27/02
[58] Field of Search .............................. 357/51, 48

[56] References Cited
UNITED STATES PATENTS 3,860,836  1/1975  Pederson ........................ 307/303

OTHER PUBLICATIONS

Weidmann, *I.B.M. Tech. Discl. Bull.,* vol. 13, No. 5, Oct. 1970.

*Primary Examiner*—Martin H. Edlow
*Attorney, Agent, or Firm*—Frank R. Trifari; Jack Oisher

[57] ABSTRACT

Improved epitaxial resistor for use in integrated circuits in which for the lateral boundary boundary zones projecting beyond the isolation zones are provided at the surface with a depth of penetration which is smaller than the thickness of the epitaxial layer. Such resistors can be manufactured with a considerably smaller spread of the resistance value than the so far usual epitaxial resistors.

7 Claims, 6 Drawing Figures

INTEGRATED CIRCUIT

This is a continuation of application Ser. No. 472,412, filed May 22, 1974, now abandoned.

The invention relates to an integrated circuit comprising an epitaxial semiconductor layer of one conductivity type provided on a semiconductor substratum of the opposite conductivity type, in which the epitaxial layer is subdivided into a number of islands of one conductivity type which are isolated from each other by means of isolation zones of the opposite conductivity type which extend from the surface of the epitaxial later at least down to the said substratum, circuit elements being provided in said islands including at least a resistor which is formed by a part of the epitaxial layer belonging to an isolated island.

As is known, epitaxial resistors are used in integrated circuits, notably when the required resistance value is so large that too much space is required for the usual construction as a zone which is provided simultaneously with the base zones of transistors. The need of resistors having a large resistance value increases according as the integrated circuits become larger and more complex. With larger circuits the space problem rapidly assumes serious forms and the circuit elements and notably the resistors must preferably have small dimensions. Furthermore, the dissipated thermal energy may form a limit for the size of the circuit. In this connection it is endeavoured to provide circuits or partial circuits having a dissipation which is as low as possible and using small currents. However, a low current level requires resistors having a comparatively high resistance value.

The use of epitaxial resistors is attractive inter alia for the above-mentioned reasons. However, in practice difficulties often present themselves, notably because in the manufacture a considerably larger spreading of the resistance value occurs than in the more conventional diffused resistors. This larger spreading is at least for a considerable part due to a spreading in the resistivity and in the thickness of the epitaxial layer. In the present-day methods of groving epitaxial layers, not unimportant differences in the doping concentration and the thickness of the grown layers occur which, however, have comparatively little influence on the properties of the circuit elements obtained in the usual manner, for example, transistors, diodes, capacitances and the like. These differences in properties of the epitaxial layer are found both when comparing individual semiconductor wafers and when comparing different parts of the same semiconductor slice. As a result of these differences, both the absolute and the relative spreading of epitaxial resistors are large so that said resistors cannot be used in many circuits due to their too large inaccuracy.

It is the object of the invention to provide a resistor for use in integrated circuits which occupies comparatively little area at the semiconductor surface and nevertheless has a comparatively high resistance value and which can be manufactured with a considerably smaller spreading than the epitaxial resistor used so far. It is inter alia based on the recognition that for such an improved resistor the epitaxial semiconductor material may be used indeed as a resistance material but that the spreading can be reduced by using in addition to the isolation zone also a less deep boundary zone for the lateral boundary.

According to the invention, an integrated circuit of the type described in the preamble is characterized in that the said part of the epitaxial layer which forms the resistor is bounded at the surface of the epitaxial layer at least for a considerable part by a boundary zone of the opposite coductivity type the depth of pepetration of which taken from the surface is smaller than the thickness of the epitaxial layer, said boundary zone constituting with the isolation zone adjoining the resistor a continuous region of the opposite conductivity type.

As a result of this comparatively simple change of the construction of the epitaxial resistor, the accuracy in the manufacture is considerably improved particularly when the boundary zone has a comparatively large gradient of the doping concentration in the proximity of the p-n junction.

An important preferred embodiment according to the invention is characterized in that one of the isolated islands comprises a transistor having a base zone of the opposite conductivity type, the boundary zone and said base zone being provided simultaneously in the epitaxial layer and hence showing substantially the same depth of penetration and substantially the same profile of the doping concentration. For this embodiment no extra operation whatsoever need be introduced into the usual manufacturing process.

The boundary zone preferably has two oppositely located parts between which a part of the resistor is present in which the current paths are substantially parallel to the facing edges of the two parts of the boundary zone.

In a further important embodiment the part of the isolated island which forms the resistor is elongate and has a widening for electric connection at least at one of the ends, the narrower part of the resistor adjoining said widening being bounded at the surface on both oppositively located sides by the boundary zone.

The invention will be described in greater detail with reference to a few embodiments and the accompanying drawings, in which FIG. 1 is a diagrammatic plan view of a part of an integrated circuit according to the invention and FIGS. 2 and 3 are diagrammatic cross-sectional views of said integrated circuit taken on the line II—II and the line II—III, respectively, of FIG. 1;

Figure 1:
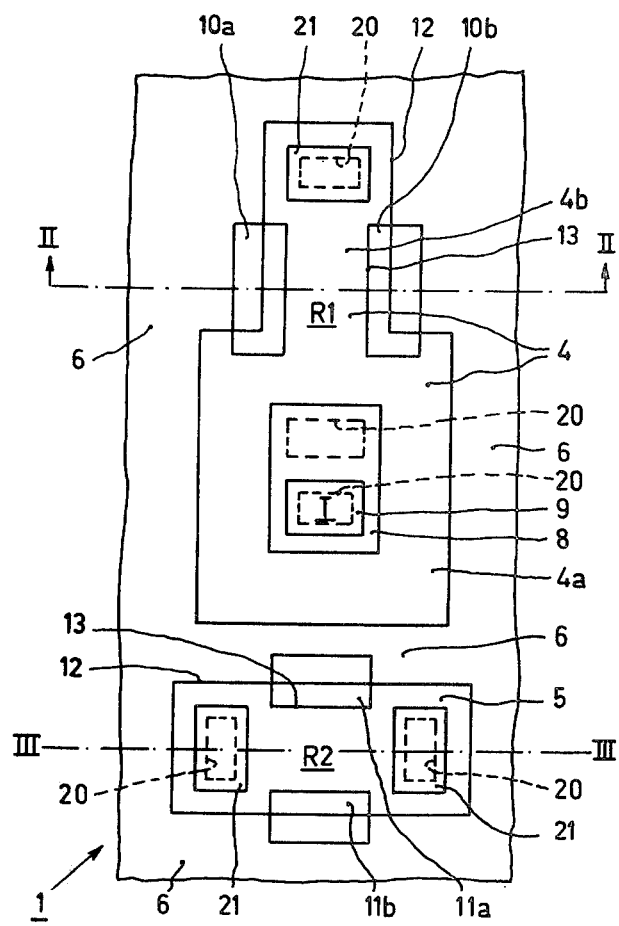
Figure 2:
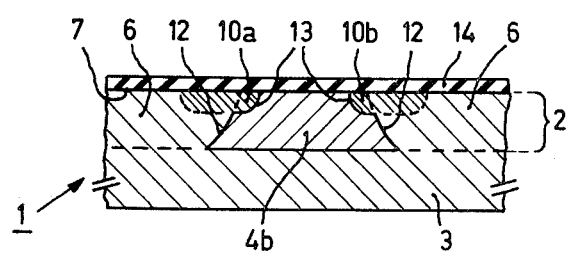
Figure 3:
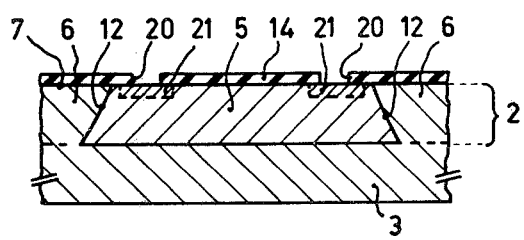

The embodiment shown in FIGS. 1, 2 and 3 relates to an integrated circuit having a semiconductor body 1 of, for example, silicon which is formed by an epitaxial layer 2 of one conductivity type and a substrate 3 of the opposite conductivity type which forms the semiconductor substratum on which the epitaxial layer 2 is provided. The epitaxial layer 2 is subdivided into a number of islands 4, 5 of one conductivity type which are isolated from each other by means of isolation zones 6 of the opposite conductivity type which extend from the surface 7 of the epitaxial layer 2 at least down to the substrate 3, circuit elements, namely the transistor T and the resistors $R_1$ and $R_2$, being provided in the said islands 4,5. The transistor shown has an emitter zone 9, a base zone S and a collector zone 4a which in the semiconductor body immediately adjoins a part 4b of the isolated island 4 which forms the resistor $R_1$. The resistor $R_2$ is formed by the isolated island 5.

According to the invention, the resistor $R_1$ is bounded for a considerable part at the surface 7 of the epitaxial layer 2 by a boundary zone $10^{a,b}$ of the opposite conductivity type the depth of penetration of which from the surface 7 is smaller than the thickness of the epitaxial layer 2. The resistor $R_2$ also has such a boundary zone which is denoted in FIG. 1 by $11^{a,b}$.

The boundary zones $10^{a,b}$ and $11^{a,b}$ preferably have substantially the same surface concentration and substantially the same concentration profile of doping inpurity as the base zone 8 of transistor T. In that case they may be provided simultaneously with said base zone so that no extra operations need be introduced into the manufacturing process.

An insulating layer 14 in which apertures 20 for the electric connection of the circuit elements are provided is present on the semiconductor body 1. By means of a pattern of conductor tracks (not shown) which is provided on the insulating layer 14, the circuit elements can be connected to form a circuit.

In order to improve the contact between the conductor tracks and the semiconductor resistors, for example, more highly doped contact zones 21 which are of the same conductivity type as the islands 4 and 5 may be used at the area of the apertures 20.

On one side of the resistor $R_1$ immediately adjoins the collector zone $4^a$ of the transistor T. This collector zone $4^a$ may comprise, if necessary, a buried layer (not shown), as a result of which the collector series resistance of the transistor T itself is substantially negligible relative to the resistor $R_1$ incorporated in the collector circuit. At the other end the resistor $R_1$ may be connected to the pattern of conductor tracks.

The resistor $R_2$ may be connected at both ends to the pattern of conductor tracks.

At least at the surface, the two resistors $R_1$ and $R_2$ have a geometrical shape which is usual for resistors and which consists of two widenings for connection purposes and an intermediately located narrower part which forms the actual resistor. Dependent upon the desired resistance value, said narrower part may be straight as shown in this example, but it may also be, for example, meander-shaped. If desired, more than two electric connections may also be provided on the same resistance region. A resistor having three contacts may be used, for example, as a voltage divider.

Figure 4:
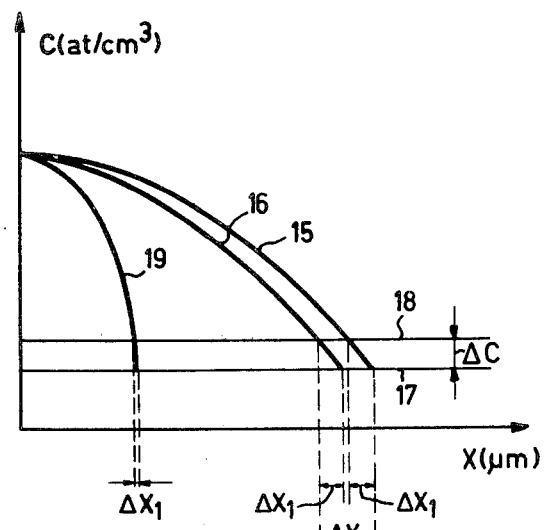
FIG. 4 shows a number of curves representing a variation of the doping concentration in the semi-conductor material as a function of the distance to the semiconductor surface.

It has been found that the resistance values of the described epitaxial resistors $R_1$ and $R_2$ are considerably more accurate than those of comparable epitaxial resistors of the conventional shape without extra boundary zones $10^{a,b}$ and $11^{a,b}$, respectively. This particularly favorable effect of the boundary zones can probably be understood as follows. The isolation zones 7 are comparatively deep diffused zones for which a comparatively long diffusion treatment at elevated temperature is necessary. As a result of this the variation of the doping concentration as a function of the distance to the surface through which the dopant penetrates into the semiconductor body is comparatively weak. The gradient of the concentration is small. Moreover, changes in this variation of the concentration may occur inter alia as a result of the uncertainty in the thickness of the epitaxial layer 2. Particularly in circuits having a large packing density tolerances which are so small as possible will often be used, it being of importance to minimize especially the lateral extent of the isolation zones by keeping the diffusion time as short as possible. The diffusion treatment is terminated as soon as the isolation zones reach down to the substrate and the mutual isolation of the islands is ensured. FIG. 4 shows two curves 15 and to which show a variation of the doping concentration of the isolation zones. The difference between said curves may in general be caused, for example, by a difference in diffusion time and/or diffusion temperature. Besides, differences often occur in the doping concentration of the epitaxial layer. FIG. 4 shows two lines 17 and 18 having a concentration difference $\Delta C$ for the doping concentration in the epitaxial layer which for simplicity is assumed to be homogeneous. The point of intersection of the curve 15 (or 16) with the line 17 (or 18) determines the place where the doping concentration of the isolation zone is equal to that of the epitaxial layer and hence also the place of the p-n junction 12 between the isolation zone and the epitaxial layer. As shown in the FIG. a concentration difference $\Delta C$ of the epitaxial layer results in a shift $\Delta X_1$ of the p-n junction. When said concentration difference $\Delta C$ is combined with a small deviation of the concentration profile in the isolation zones, shifts of a value $\Delta X_2$ may even occur. Particularly with epitaxial resistors having a comparatively small width, that is to say a small dimension in the direction parallel to the surface and transverse to the direction of current flow, considerable differences in width are easily formed thereby. In addition to the variation in the doping concentration of the epitaxial layer itself, said width variations also have an important influence on the resistance value of the epitaxial resistors of the usual shape.

For comparison, FIG. 4 shows the curve 19 which represents the much steeper variation of the doping concentration of the boundary zones $10^{a,b}$ and $11^{a,b}$. In this example, the same surface concentration is chosen as for the isolation zones. The larger gradient then is immediately associated with the depth of penetration which is considerably, smaller as compared with the isolation zones. Furthermore, thickness variations in the epitaxial layer need not be taken into account in this diffusion treatment. Moreover, the profile 19 of boundary zones which are obtained simultaneously with the base zones in the manufacturing process used is comparatively readily fixed, inter alia, for example, because the depth of penetration is also decisive of such important parameters as the base thickness of the transistors to be manufactured by the said process. In this case it also is helpful that the masking layer which is used for providing said boundary zones may be thinner than that used for the insolation zones, so that the apertures in said thinner masking layer are more accurately defined. As shown in the Figure the variation $\Delta X_1$ in the place of the p-n junction 13 between the boundary zone and the epitaxial layer in this more accurate and steeper profile 19 is much smaller and substantially negligible. By using the boundary zone, the width of the epitaxial resistor, at least for the surface-adjoining part thereof, is considerably better established and the spreading in the manufacture is considerably reduced.

In connection with the desired large gradient of the doping concentration the depth of penetration of the boundary zone preferably is not too large. On the other hand, the depth of penetration may not be too small because actually the improved definition only occurs at the surface-adjoining part of the resistor, whereas the width of the underlaying substrate-adjoining part is still determined by the isolation zones. The ratio between the thickness of the epitaxial layer and the depth of penetration of the boundary, zones preferably is 2 to 3. That with this ratio the spread in resistance value is reduced to a considerable extent may also be ascribed to the fact that the dopant in the substrate, during the growth of the epitaxial layer and the further operations or treatments at high temperature required for the device manufacture, penetrate into the epitaxial layer. Since the conductivity types of the substrate and the epitaxial layer are opposite to each other, compensation occurs in the substrate-adjoining part of the epitaxial layer so that the resistivity of this part is larger than that of the surface-adjoining part. As a result of this the resistance value is just determined to a considerable extent by the surface-adjoining more highly doped part.

The resistors $R_1$ and $R_2$ are partly bounded at the surface 7 by the n-n junction 13 between the boundary zones $10^{a,b}$ and $11^{a,b}$, respectively, and the islands 4 and 5, respectively, and for the remaining part by the p-n junction 12 between the isolation zone 6 and the islands 4 and 5, respectively. The boundary zone may also extend along the whole circumference of the resistor. However, some area may be saved at the surface without objection and the boundary zone be restricted to that part of the edge which bounds the part of the isolated island determining the resistance value of the resistor. Therefore, in the resistors $R_1$ and $R_2$ a considerable part of the edge, namely the edge of the narrower part which adjoins the widenings serving for connection and which is decisive to a considerable extent for the resistance value, is determined on the two oppositely located sides of the resistor by the boundary zones consisting of two parts $10^a$ and $10^b$ and $11^a$ and $11^b$, respectively.

It is to be noted that the boundary zone on one single side of the narrower part of the resistor also already provides an improvement of the accuracy of the resistance value. However, a part of this improvement is lost in that in this case the width of the resistor also depends upon an alignment step. One part of the edge is obtained while providing the isolation zones, while the oppositely located part of the edge is defined only in a later stage while providing the boundary zone. For these two operations different masks are necessary which have to be aligned relative to each other.

The resistance value of the epitaxial resistor according to the invention preferably is at least 1 k.Ohm.

In the present example the thickness of the epitaxial layer 2 is approximately 6 μm. The resistivity of said layer is, for example, approximately 0.6 Ohm.cm. A resistance of, for example, approximately 1.5 k.Ohm may then be obtained with a distance between the boundary zones $11^a$ and $11^b$ of, for example, approximately 10 μm and a length of the narrower part of the resistor of approximately 15 μm. The mask for the isolated island then consists, for example, of a rectangle of approximately 53 μm by 24 μm. After diffusing the isolation zones 6, the island 5 at the surface 7 has dimensions of approximately 43 μm by 14 μm. The diffused boundary zones $11^a$ and $11^b$ at the surface are, for example, approximately 15 μm by 10 μm and extend down to a depth of approximately 2.7 μm in the semiconductor body. The more highly depend zones 21 are, for example, 10 μm by 10 μm. The surface concentration of the doping of the boundary zones is, for example, approximately $5 \times 10^{18}$ to $10^{19}$ at/cm$^3$ while that of the isolation zones after completion of the diffusion treatment usually is of the same order of magnitude.

The mutually parallel edges of the diffusion windows in the masking layer for the isolation zone 6 and the boundary zones $11^{a,b}$ are spaced apart by approximately 5 μm. This distance is approximately equal to the distance measured along the surface between the edge of the diffusion window of the isolation zone 6 and the junction of said zone with the island 5 after providing said zone 6. As in providing the isolation zone 6, lateral diffusion also occurs upon diffusing the boundary zones, that is to say diffusion in a direction substantially parallel to the surface. As a result of this lateral diffusion the boundary zones which are present for the greater part within the isolation zone 6, ultimately project approximately 2 μm beyond the isolation zone into the island. Preferably the boundary zone ultimately projects to a minimum distance beyond the insulation zone, that is to say 1 to 3 and at most 5 μm.

For completeness' sake it is to be noted that the distance over which the boundary zone projects beyond the isolation zone may be different for the two opppositely located edges of the resistor as a result of small deviations in aligning the masking layer. The distance over which the boundary zone projects is preferably chosen to be equal to the maximum deviation by which in aligning the mask is considered to be still permissable so that in the most infavorable case the edge of the boundary zone at the surface coincides on one side substantially with that of the isolation zone and projects over a distance 2 W at the oppositely located side. Furthermore, the width of the part of the resistance region at the surface which is decisive of the resistance value is preferably at most equal to 5 times the thickness of the epitaxial layer.

The integrated circuit described can be obtained entirely with manufacturing methods conventionally used in semiconductor technology.

Figure 5:
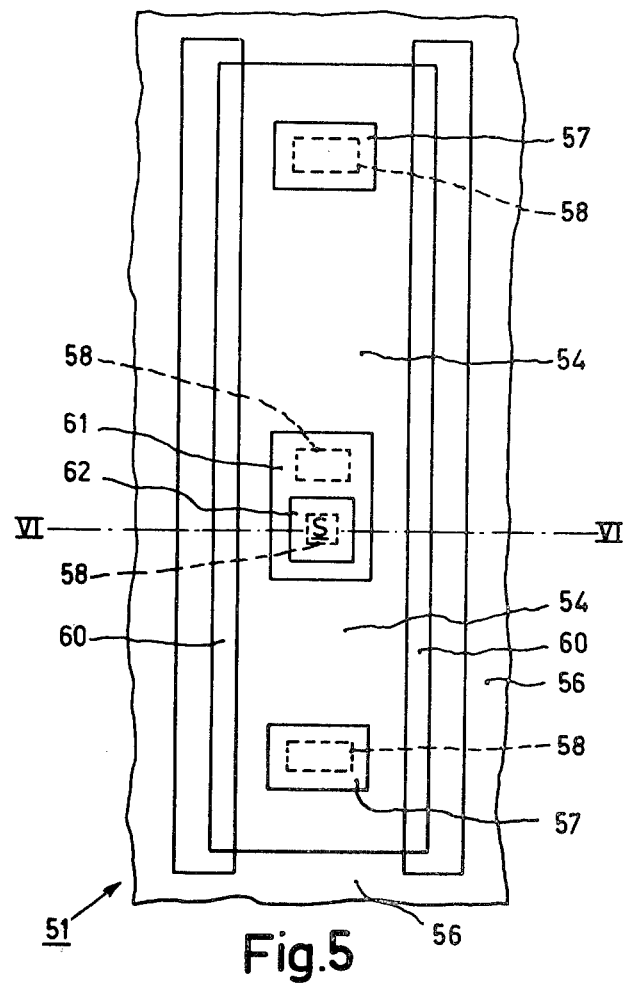
FIG. 5 is a diagrammatic plan view of a part of a second integrated circuit according to the invention.
Figure 6:
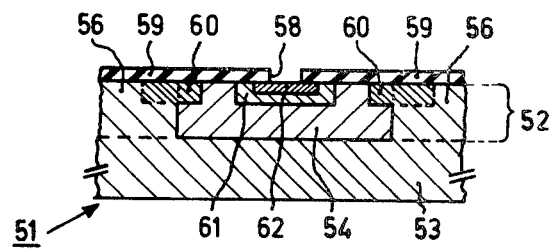
FIG. 6 is a diagrammatic cross-sectional view belonging to the said example and taken on the line VI — VI of FIG. 5.

The second embodiment relates to an integrated circuit a part of which is shown in FIGS. 5 and 6. A semiconductor body 51 consists of a substrate 53 and an epitaxial layer 52 of different conductivity types. A part 54 of the epitaxial layer 52 is separated from the remaining part (not shown) of the device by means of an isolation zone 56 surrounding said part. Said isolated part 54 forms an electric resistor having an elongate shape in which at the ends a contact zone 57 is present for the electric connection. Via broken-line apertures 58 in an insulating layer 59 present on the semiconductor surface, conductor tracks (not shown) can be connected to the contact zones 57.

A projecting boundary zone 60 of the same conductivity type as the isolation zones 56 is present along each of the two elongate edges of the resistance region 51. Said boundary zones 60 determine at the surface the width of the resistance region 54.

A three-layer-transistors S formed by a part of the resistance region 54, a base zone in the form of surface zone 61 and a further surface zone 62 is present in the resistance region 52 between the two contacts 57 of the resistor. The epitaxial resistor forms a voltage divider to a center tap of which the transistor S is connected. The further surface zone 62 may be used as an emitter or as a collector of the transistor S dependent upon the electric voltages applied to the said zone, to the base 61 and to the contacts 57 of the resistor.

The boundary zones 60 extend along the edges of the resistor, along the transistor S and along and to beyond the contact zones 57.

Instead of the transistor S another circuit element, for example, a capacitance or a diode, may be connected in a corresponding manner to the voltage divider. If desired, several circuit elements may also be provided in the same resistance region. The dimensions of the epitaxial resistor and the circuit element S and the distances from the circuit element S to each of the two contacts 57 may be adapted to specific requirements for each individual integrated circuit.

This embodiment also can be manufactured entirely with methods conventionally used in semiconductor technology, in which the boundary zones 60 and the surface zone 61 of the circuit element S are preferably provided simultaneously in the same operation and with the same doping concentration.

It will be obvious that the invention is not restricted to the embodiments described and that many variations are possible to those skilled in the art without departing from the scope of this invention. The resistor R2 in the first embodiment has a dumbell-like circumference at the surface, the orginal circumference determined by the isolation zone 6 being a rectangle. However, the original circumference may also be dumbell-like already, a further restriction of said dumbell shape being obtained by the boundary zone. Furthermore, other semiconductor materials such as germanium or $A_{III}B_V$ compounds may be used and, for example, ion implantation may be considered as a doping technique, notably for providing the boundary zone. Instead of directly on a substrate, the epitaxial layer may also be provided, for example, on an epitaxial layer provided on a substrate, the last-mentioned epitaxial layer forming the semiconductor substratum for the epitaxial resistor. If desired, the collector zone $4^a$ of transistor T (FIG. 1) may also have a collector contact (not shown). By means of such a contact, for example, the voltage at the collector zone may be sensed and supplied to another point of the circuit. In that case this contact preferably lies in the region $4^a$ and between the transistor T and the resistor $R_2$, and thus close to the emitter zone 9 of transistor T.

What is claimed is:

1. An integrated circuit comprising a semiconductor body having an epitaxial semiconductor layer of a first type conductivity and of a given thickness on a semiconductor substrate of a second opposite type conductivity, isolation zones of the second type conductivity extending through the epitaxial layer to define in the epitaxial layer a plurality of first type conductivity isolated islands, plural circuit elements selected from the group consisting of resistors, capacitors, diodes and transistors being located in said islands, at least one of said circuit elements being a resistor formed by the first type epitaxial layer material of one of said islands, means for effecting electrical connection to spaced points of the epitaxial layer material in said one island to form resistor connections for said resistor, the doping near the surface of the epitaxial material in said one island where it remains of the first type being substantially homogenous, and a surface boundary zone of the second type conductivity located in the isolation zone and adjoining a substantial part of the boundary of the said island containing the resistor forming a P-N junction determining the overall resistance of the resistor between its connection points, said boundary zone having a depth of penetration which is smaller than the thickness of the epitaxial layer, the concentration of second type dopants in the isolation zones being greater than the concentration of first type dopants in the isolated islands, and the concentration gradient of second type dopants at the boundary zone-island P-N junction being substantially greater than that at the isolation zone-island P-N junction.

2. An integrated circuit as claimed in claim 1 wherein the ratio of epitaxial layer thickness to boundary zone penetration depth is in the range of about 2 to about 3.

3. An integrated circuit as claimed in claim 2 wherein the boundary zone comprises at least two oppositely located parts bounding an area of the said one island located between the resistor connection points.

4. An integrated circuit as claimed in claim 3 wherein the boundary zone parts each overlaps the P-N junction formed between the first type epitaxial material and the second type isolation zone.

5. An integrated circuit as claimed in claim 4 wherein the major portion of each boundary zone part extends within the isolation zone and only a minor portion extends laterally beyond the underlying P-N junction between the isolation zone and the island and into the latter, the lateral extension into the island of each of the boundary zone parts being smaller than the lateral separation between the boundary zone parts.

6. An integrated circuit as claimed in claim 5 wherein the circuit elements include a transistor having a second type base zone, said second type base zone and said second type boundary zone having second type dopant profiles which are substantially alike.

7. An integrated circuit as claimed in claim 5 wherein the resistor has a generally dumbbell-like shape with widened parts at its connection points and a narrower part bounded at the surface on opposite sides by the oppositely located boundary zone parts.

* * * * *

UNITED STATES PATENT OFFICE
CERTIFICATE OF CORRECTION

Patent No. 4,011,580            Dated March 8, 1977

Inventor(s) Wolfdietrich Georg Kasperkovitz

It is certified that error appears in the above-identified patent and that said Letters Patent are hereby corrected as shown below:

On the Title page, insert -- [30] Foreign Application

Priority Data May 30, 1973

Netherlands ............ 7307527 --.

Col. 1, line 43, change "groving" to -- growing --.

Col. 3, line 3, change "S" to -- 8 --.

Col. 4, line 9, change "to" to -- 16 --.

line 43, cancel the comma.

Col. 5, line 7, cancel the comma.

line 10, change "dopant" to -- dopants --.

line 68, change "depend" to -- doped --.

UNITED STATES PATENT OFFICE
CERTIFICATE OF CORRECTION

Patent No. 4,011,580     Dated March 8, 1977

Inventor(s) Wolfdietrich George Kasperkovitz

It is certified that error appears in the above-identified patent and that said Letters Patent are hereby corrected as shown below:

Col. 6, line 59, "change "51" to -- 54 --.

line 61, change "transistors" to -- transistor --.

Col. 7, lines 25, 28 & 29, change "dumbell" to -- dumbbell --.

Signed and Sealed this nineteenth Day of July 1977

[SEAL]

Attest:

RUTH C. MASON  
Attesting Officer

C. MARSHALL DANN  
Commissioner of Patents and Trademarks